(12) United States Patent
Sawada (10) Patent No.: US 10,070,513 B2
(45) Date of Patent: Sep. 4, 2018

(54) HIGH-FREQUENCY MODULE AND COMMUNICATION APPARATUS

(71) Applicant: Murata Manufacturing Co., Ltd., Kyoto (JP)

(72) Inventor: Yoichi Sawada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/699,202

(22) Filed: Sep. 8, 2017

(65) Prior Publication Data

US 2018/0077790 A1 Mar. 15, 2018

(30) Foreign Application Priority Data

Sep. 9, 2016 (JP) .................................. 2016-176668

(51) Int. Cl.

| H04B 1/44 | (2006.01) |
|---|---|
| H05K 1/02 | (2006.01) |
| H03F 1/26 | (2006.01) |
| H03F 3/195 | (2006.01) |
| H03F 3/213 | (2006.01) |
| H04B 1/46 | (2006.01) |
| H04B 1/40 | (2015.01) |
| H05K 1/16 | (2006.01) |
| H05K 1/18 | (2006.01) |

(52) U.S. Cl.
CPC ............. *H05K 1/0228* (2013.01); *H03F 1/26* (2013.01); *H03F 3/195* (2013.01); *H03F 3/213* (2013.01); *H03F 2200/111* (2013.01); *H03F 2200/294* (2013.01); *H03F 2200/451* (2013.01); *H04B 1/40* (2013.01); *H05K 1/165* (2013.01); *H05K 1/181* (2013.01); *H05K 2201/09254* (2013.01); *H05K 2201/10015* (2013.01); *H05K 2201/10053* (2013.01); *H05K 2201/10098* (2013.01)

(58) Field of Classification Search
CPC ........ H05K 1/0228; H05K 1/181; H03F 1/26; H03F 3/195; H03F 3/213; H03F 2200/111; H03F 2200/294; H03F 2200/451
USPC ................................ 455/78–83, 552.1–553.1
See application file for complete search history.

(56) References Cited

U.S. PATENT DOCUMENTS

| 7,596,357 B2 * | 9/2009 | Nakamata | ............ H04B 1/0057 455/78 |
|---|---|---|---|
| 2009/0207764 A1 * | 8/2009 | Fukamachi | ............... H04B 1/44 370/297 |
| 2012/0306716 A1 | 12/2012 | Satake | |

FOREIGN PATENT DOCUMENTS

WO 2011/061946 A1 5/2011

* cited by examiner

*Primary Examiner* — Lee Nguyen
(74) *Attorney, Agent, or Firm* — Pearne & Gordon LLP (57) ABSTRACT

A high-frequency module includes: a power receiving terminal; an LNA, a reception switch that switches among a plurality of signals in different bands and outputs the signals to the LNA; a first conduction path spanning from the power receiving terminal to a power source terminal of the reception switch; a second conduction path spanning from a branching point in the first conduction path to a power source terminal of the LNA; a third conduction path branching from at least one of the first conduction path and the second conduction path and spanning to a ground; and a capacitor inserted into the third conduction path. A second inductance of the second conduction path is greater than a first inductance of a part spanning from the branching point in the first conduction path to the power source terminal.

10 Claims, 5 Drawing Sheets

PRIOR ART

HIGH-FREQUENCY MODULE AND COMMUNICATION APPARATUS

This application claims priority from Japanese Patent Application No. 2016-176668 filed on Sep. 9, 2016. The content of this application is incorporated herein by reference in its entirety.

BACKGROUND

The present disclosure relates to a high-frequency module and a communication apparatus.

Recently, high-frequency circuits capable of switching signal paths are used in various types of communication apparatuses (see, for example, International Publication No. WO 2011/061946, called "Patent Document" hereinafter).

Figure 7:
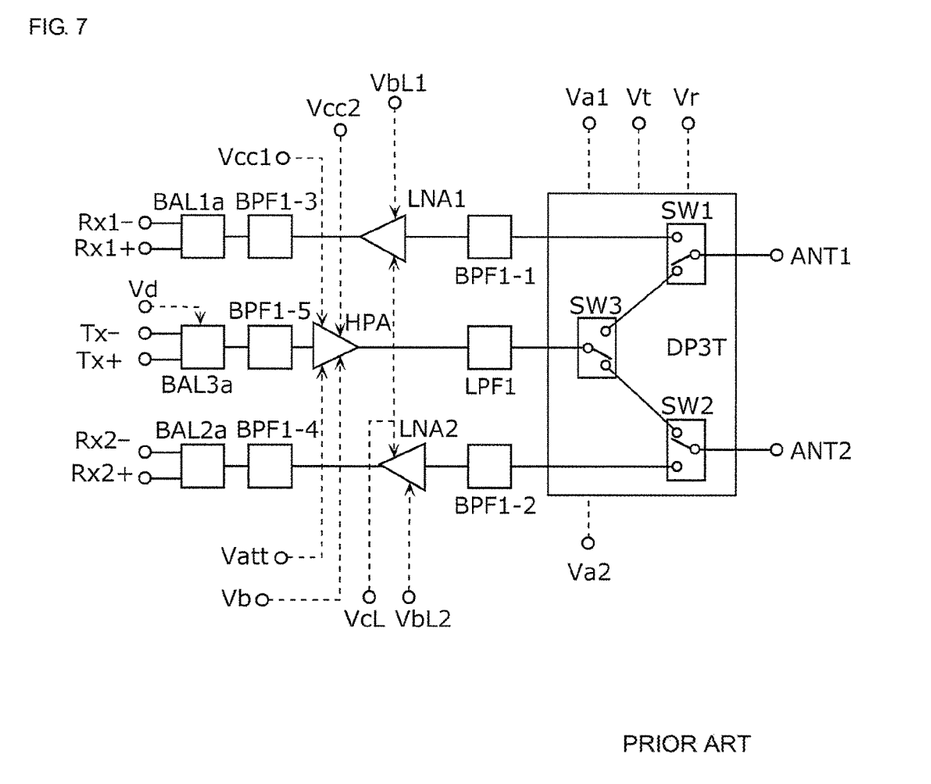
FIG. 7 is a block diagram illustrating a high-frequency circuit according to a past example.

FIG. 7 is a block diagram illustrating a high-frequency circuit disclosed in Patent Document. This high-frequency circuit includes first and second antenna terminals ANT1 and ANT2, a differential transmission terminal Tx, a first reception terminal Rx1, a second reception terminal Rx2, and a switching circuit DP3T. The switching circuit DP3T switches between connecting and disconnecting a desired signal path in accordance with voltages supplied to power source terminals Va1, Va2, Vt, and Vr. Meanwhile, a high-frequency amplifying circuit HPA and low-noise amplifying circuits LNA1 and LNA2 are turned on and off in accordance with voltages supplied to power source terminals Vcc1, Vcc2, Vb, Vatt, VbL1, VbL2, and VcL.

According to this high-frequency circuit, transmission and reception operations are switched and the optimal antenna for transmission operations is selected (what is known as "transmission diversity operations"), for example, in accordance with combinations of voltages supplied to the power source terminals.

Patent Document also discloses the ability to share power source terminals such that the high/low level of an applied voltage is continually supplied as the same voltage, as well as using such sharing to reduce the number of power source terminals and power source lines, simplify the structure of the circuit components, and make it easier to miniaturize the circuit components.

However, if the power source terminals and power source lines are simply shared, there is still the risk of noise sneaking in through the shared power source terminals and power source lines.

BRIEF SUMMARY

Accordingly, the present disclosure provides a high-frequency module capable of sharing power source terminals and power source lines to supply power to a plurality of circuits while suppressing noise that sneaks in through the shared power source terminals and power source lines.

According to embodiments of the present disclosure, a high-frequency module includes: a board; a power receiving terminal, disposed on the board, for receiving a power supply from a power source; an amplifying circuit disposed on the board; a switch circuit, disposed on the board, that switches among a plurality of signals in different bands and communicates the signals to the amplifying circuit; a first conduction path spanning from the power receiving terminal to a power source terminal of the switch circuit; a second conduction path spanning from a branching point in the first conduction path to a power source terminal of the amplifying circuit; a third conduction path that branches from at least one of the first conduction path and the second conduction path and spans to a ground; and a capacitor inserted into the third conduction path. Here, when an inductance value of an exclusive part spanning from the branching point in the first conduction path to the power source terminal of the switch circuit is taken as a first inductance and an inductance value of the second conduction path is taken as a second inductance, the second inductance is greater than the first inductance.

According to this configuration, a source voltage taken by the power receiving terminal is supplied to the amplifying circuit and the switch circuit by sharing the part spanning from the power receiving terminal of the first conduction path to the branching point. Accordingly, although the number of power receiving terminals can be reduced and the conduction paths can be simplified, there is a risk that noise from the switch circuit will sneak into the amplifying circuit through the first and second conduction paths. In response to this, the second inductance of the second conduction path is set to be higher than the first inductance of the exclusive part spanning from the branching point in the first conduction path to the power source terminal of the switch circuit. As a result, noise sneaking into the amplifying circuit from the switch circuit through the first and second conduction paths is dampened by the second conduction path. As a result, a high-frequency module capable of sharing power source terminals and power source lines to supply power to a plurality of circuits while suppressing noise that sneaks in through the shared power source terminals and power source lines can be obtained.

Furthermore, the effects of source noise on the amplifying circuit and the switch circuit are reduced by the capacitor, and thus a high-frequency module having excellent noise characteristics can be obtained.

According to embodiments of the present disclosure, the first conduction path and the second conduction path may be constituted by a first wiring conductor and a second wiring conductor, respectively, and the second wiring conductor may be longer than the exclusive part spanning from the branching point in the first wiring conductor to the power source terminal of the switch circuit.

According to this configuration, assuming that the second wiring conductor and the exclusive part of the first wiring conductor have substantially the same inductance value per unit of length, the second inductance can be set to be higher than the first inductance.

According to embodiments of the present disclosure, the first conduction path may be constituted by a first wiring conductor, and the second conduction path may be constituted by a second wiring conductor and an inductor element inserted into the second wiring conductor.

According to this configuration, the second inductance can be made higher than the first inductance on the basis of the inductance of the inductor element.

According to embodiments of the present disclosure, the switch circuit and the amplifying circuit may be provided within a single integrated circuit chip, the power source terminal of the switch circuit may serve as a first power source terminal of the integrated circuit chip, and the power source terminal of the amplifying circuit may serve as a second power source terminal of the integrated circuit chip.

According to this configuration, the switch circuit and the amplifying circuit are constituted by a single integrated circuit chip, and thus the high-frequency module can be reduced in size.

According to embodiments of the present disclosure, the high-frequency module may further include a demultiplexing circuit disposed on the board and a fourth conduction path spanning from the switch circuit to the demultiplexing circuit. Here, the configuration may be such that when the board is viewed in plan view, the fourth conduction path does not intersect with any of the first conduction path, the second conduction path, and the third conduction path.

According to this configuration, when the board is viewed in plan view, the fourth conduction path serving as a signal path does not intersect with any of the first, second, and third conduction paths serving as power source paths, and thus the noise characteristics of the high-frequency module can be improved further.

According to embodiments of the present disclosure, the capacitor may be a ceramic capacitor.

According to this configuration, a ceramic capacitor, which generally has a low volume with respect to its capacitance, is used as the capacitor, and thus the high-frequency module can be reduced in size.

According to the high-frequency module according to embodiments of the present disclosure, a high-frequency module capable of sharing power source terminals and power source lines to supply power to a plurality of circuits while suppressing noise that sneaks in through the shared power source terminals and power source lines can be obtained.

Other features, elements, characteristics and advantages of the present disclosure will become more apparent from the following detailed description of embodiments of the present disclosure with reference to the attached drawings.

DETAILED DESCRIPTION

Hereinafter, embodiments of the present disclosure will be described in detail with reference to the drawings. Note that the embodiments described hereinafter provide comprehensive or specific examples. The numerical values, shapes, materials, constituent elements, arrangements of constituent elements, forms of connection, and so on described in the following embodiments are merely examples, and are not intended to limit the present disclosure. Of the constituent elements described in the following embodiments, constituent elements not mentioned in the independent claims are described as optional constituent elements. Furthermore, the sizes or size ratios of the constituent elements illustrated in the drawings are not necessarily exact.

First Embodiment

A high-frequency module according to a first embodiment is, for example, a composite component used in a front-end circuit of a multi-band-(multiple frequency bands)/multi-mode-(multiple wireless communication standards) compliant communication apparatus. The high-frequency module has a plurality of signal paths for processing high-frequency (RF) signals in different bands/modes, and processes an RF signal of a desired band/mode by switching signal paths between being connected and disconnected.

Figure 1:
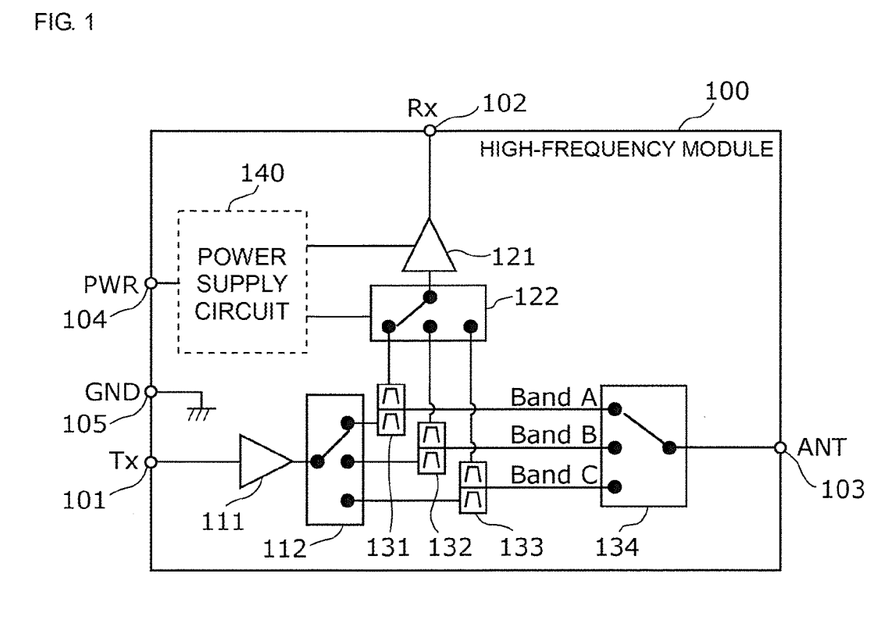
FIG. 1 is a block diagram illustrating an example of the functional configuration of a high-frequency module according to a first embodiment.

FIG. 1 is a block diagram illustrating an example of the functional configuration of the high-frequency module according to the first embodiment. A high-frequency module 100 illustrated in FIG. 1 processes an RF signal of a single band selected from among three different bands, namely Band A, Band B, and Band C. The three bands may be bands corresponding to different wireless communication standards. Full-duplex communication through frequency division is carried out in each band by using a transmission sub-band and a reception sub-band.

The high-frequency module 100 includes a power amplifier (PA) 111, a transmission switch 112, a low-noise amplifier (LNA) 121, a reception switch 122, duplexers 131, 132, and 133 for corresponding bands, an antenna switch 134, and a power supply circuit 140.

The PA111 amplifies a transmission RF signal received through an RF signal input terminal 101, and transmits that RF signal to the transmission switch 112.

The transmission switch 112 outputs the transmission RF signal received from the PA111 to a signal path of the selected band in accordance with a control signal (not illustrated).

The LNA121 amplifies a reception RF signal received from the reception switch 122 and outputs that RF signal to an RF signal output terminal 102.

The reception switch 122 receives reception RF signals from the duplexers 131, 132, and 133, respectively. Of the received reception RF signals, the reception switch 122 outputs the reception RF signal of the selected band to the LNA121 in accordance with a control signal (not illustrated).

The duplexers 131, 132, and 133 are provided for corresponding bands, and combine/isolate transmission RF signals in the transmission sub-band and reception RF signals in the reception sub-band within those bands.

The antenna switch 134 connects the signal path of the selected band and an antenna terminal 103 in accordance with a control signal (not illustrated).

A power receiving terminal 104 and a ground terminal 105 take a source voltage and a ground voltage, respectively, from a power supply circuit (not illustrated).

The power supply circuit 140 is a circuit that supplies a source voltage taken by the single power receiving terminal 104 to the LNA121 and the reception switch 122. Although a power supply circuit that supplies power to the PA111, the transmission switch 112, and the antenna switch 134 is not illustrated, it should be noted that the same type of power supply circuit as the power supply circuit 140 can be used.

In this configuration, the LNA121 is an example of an amplifying circuit, and the reception switch 122 is an example of a switch circuit. The duplexers 131, 132, and 133 are examples of demultiplexing circuits.

Primary parts of the high-frequency module 100, including the power supply circuit 140, will be described next.

Figure 2:
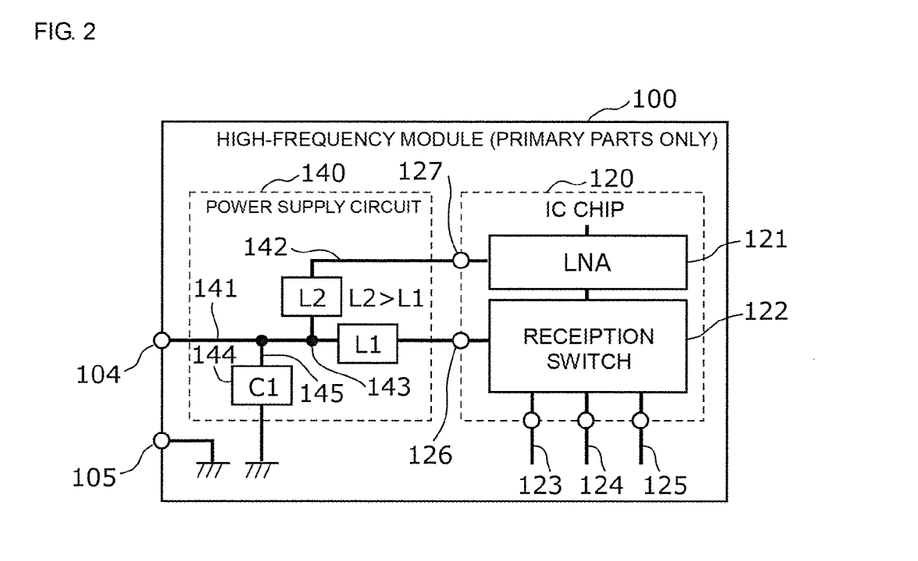
FIG. 2 is a block diagram illustrating an example of the functional configuration of the primary parts of the high-frequency module according to the first embodiment.

FIG. 2 is a block diagram illustrating an example of the functional configuration of the primary parts of the high-frequency module 100. In the example illustrated in FIG. 2, the LNA121 and the reception switch 122 are provided within a single integrated circuit (IC) chip 120. The IC chip 120 includes a power source terminal 126 serving as a power source terminal of the reception switch 122, and a power source terminal 127 serving as a power source terminal of the LNA121.

The power supply circuit 140 includes a first conduction path 141 spanning from the power receiving terminal 104 to the power source terminal 126 of the reception switch 122, and a second conduction path 142 spanning from a branching point 143 in the first conduction path 141 to the power source terminal 127 of the LNA121. Here, the first and second conduction paths 141 and 142 are provided such that a second inductance L2 of the second conduction path 142 is greater than a first inductance L1 of an exclusive part spanning from the branching point 143 in the first conduction path 141 to the power source terminal 126 of the switch circuit.

Additionally, the power supply circuit 140 includes a third conduction path 145 branching from at least one of the first conduction path 141 and the second conduction path 142 (the first conduction path 141, in the example illustrated in FIG. 2) and spanning to a ground, and a capacitor 144 inserted into the third conduction path 145.

The high-frequency module 100 further includes fourth conduction paths 123, 124, and 125. The fourth conduction paths 123, 124, and 125 connect the reception switch 122 and the duplexers 131, 132, and 133 (not illustrated in FIG. 2), respectively.

According to this configuration, a source voltage taken by the power receiving terminal 104 is supplied to the LNA121 and the reception switch 122, while sharing the parts from the power receiving terminal 104 of the first conduction path 141 to the branching point 143. Additionally, the second inductance L2 of the second conduction path 142 is set to be greater than the first inductance L1 of the exclusive part spanning from the branching point 143 in the first conduction path 141 to the power source terminal 126 of the reception switch 122.

Accordingly, noise sneaking into the LNA121 from the reception switch 122 and through the first and second conduction paths 141 and 142 is dampened by the second conduction path 142. As a result, noise sneaking into the LNA121 from the reception switch 122 can be suppressed while sharing the power receiving terminal 104 and part of the first conduction path 141 for the supply of power to the LNA121 and the reception switch 122.

Furthermore, the effects of source noise on the LNA121 and the reception switch 122 are reduced by the capacitor 144, and thus a high-frequency module 100 having excellent noise characteristics can be obtained.

Next, the structure of the high-frequency module 100 corresponding to the functional configuration illustrated in FIG. 2 (the arrangement of the conduction paths in particular) will be described.

Figure 3:
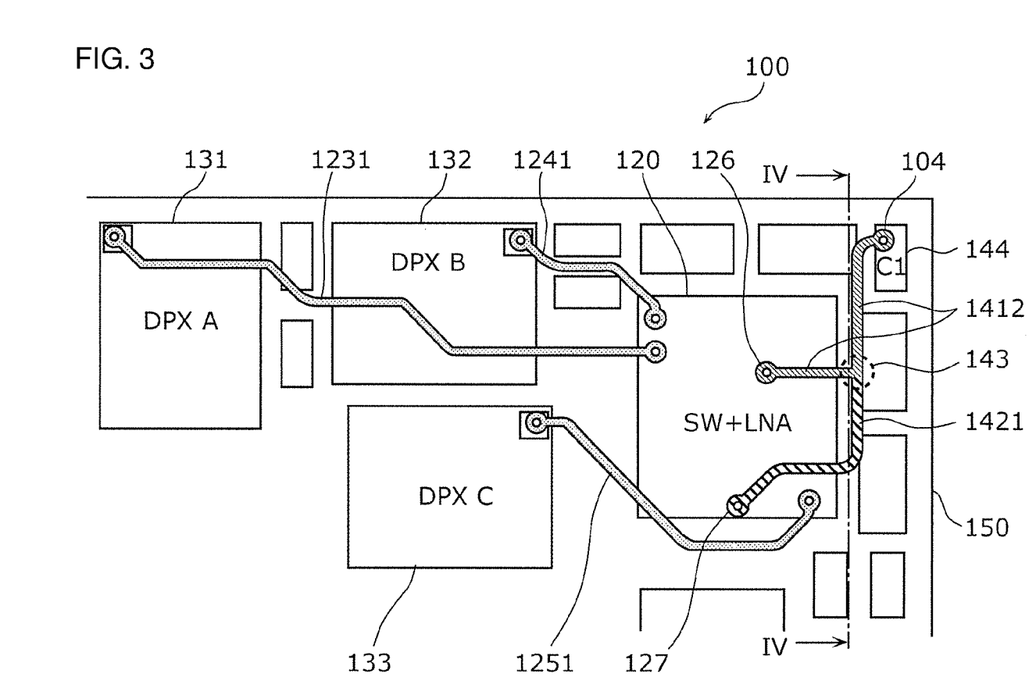
FIG. 3 is a plan view of an example of the arrangement of conduction paths in the high-frequency module according to the first embodiment.
Figure 4:
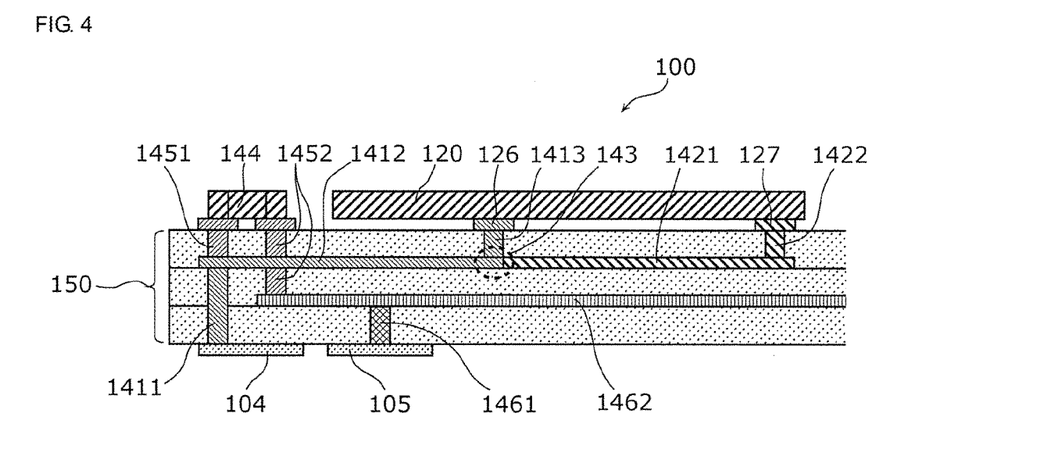
FIG. 4 is a cross-sectional view of an example of the arrangement of conduction paths in the high-frequency module according to the first embodiment.

FIGS. 3 and 4 are a plan view and a cross-sectional view illustrating an example of the structure of the high-frequency module 100. FIG. 4 corresponds to a cross-section seen from the direction of the IV-IV arrows indicated in FIG. 3, but constituent elements located in other cross-sections are also shown as appropriate to facilitate understanding.

The high-frequency module 100 is configured upon a board 150. The board 150 is a multilayer wiring board in the example illustrated in FIGS. 3 and 4.

The IC chip 120 including the LNA121 and the reception switch 122, the duplexers 131, 132, and 133, and the capacitor 144 are surface-mounted on one main surface of the board 150. A plurality of surface electrodes including the power receiving terminal 104 and the ground terminal 105 are provided on the other main surface of the board 150. The high-frequency module 100 is mounted on a motherboard such as a printed circuit board using the plurality of surface electrodes.

A conductor plane 1462 serving as a ground plane is provided in an inner layer of the board 150. The conductor plane 1462 is connected to the ground terminal 105 by an interlayer conductor 1461.

The first conduction path 141 is constituted by interlayer conductors 1411 and 1413 and a conductor plane 1412.

One end of the interlayer conductor 1411 is connected to the power receiving terminal 104. One end of the interlayer conductor 1413 is connected to the power source terminal 126 of the reception switch 122 provided in the IC chip 120.

The second conduction path 142 is constituted by a conductor plane 1421 and an interlayer conductor 1422.

One end of the conductor plane 1421 is connected to the branching point 143 in the conductor plane 1412. One end of the interlayer conductor 1422 is connected to the power source terminal 127 of the LNA121 provided in the IC chip 120.

The conductor planes 1412 and 1421 may be a single conductive foil including the branching point 143. In such a case, the branching point 143 serves as a boundary, with one part of the conductive foil serving as the conductor plane 1412 and the other part serving as the conductor plane 1421.

The third conduction path 145 is constituted by interlayer conductors 1451 and 1452. One end of the interlayer conductor 1451 is connected to the conductor plane 1412, and the other end of the interlayer conductor 1451 is connected to one end of the capacitor 144. One end of the interlayer conductor 1452 is connected to the other end of the capacitor 144, and the other end of the interlayer conductor 1452 is connected to the conductor plane 1462. The interlayer conductor 1452 and the conductor plane 1412 are in different cross-sections and are not connected.

The fourth conduction paths 123, 124, and 125 are constituted by conductor planes 1231, 1241, and 1251 and interlayer conductors (not illustrated), respectively, provided in the board 150. The fourth conduction paths 123, 124, and 125 convey the reception RF signals in each band from the duplexers 131, 132, and 133 to the IC chip 120 including the reception switch 122.

The primary parts of the high-frequency module 100 illustrated in FIG. 2 are constituted by the conduction paths arranged as described above.

In the example illustrated in FIGS. 3 and 4, the interlayer conductors 1411 and 1413 and the conductor plane 1412 correspond to a first wiring conductor constituting the first conduction path 141. The length of the exclusive part spanning from the branching point 143 in the first wiring conductor to the power source terminal 126 of the reception switch 122 is expressed as the sum of the length of a part spanning from the branching point 143 in the conductor plane 1412 to the interlayer conductor 1413 and the height of the interlayer conductor 1413.

Additionally, the conductor plane 1421 and the interlayer conductor 1422 correspond to a second wiring conductor constituting the second conduction path 142. The length of the second wiring conductor is expressed as the sum of the length of the conductor plane 1421 and the height of the interlayer conductor 1422.

Note that generally speaking, the height of an interlayer conductor is sufficiently lower than the length of a conductor plane, and thus the length of the wiring conductor may be expressed only by the length of the conductor plane, ignoring the height of the interlayer conductor.

Here, the length of the second wiring conductor is longer than the length of the exclusive part of the first wiring conductor. In other words, assuming that the second wiring conductor and the exclusive part of the first wiring conductor have substantially the same inductance value per unit of length, the second inductance L2 of the second conduction path 142 can be set to be higher than the first inductance L1 of the exclusive part of the first conduction path 141.

Meanwhile, when the board 150 is viewed in plan view as illustrated in FIG. 3, the fourth conduction paths 123, 124, and 125, which serve as reception RF signal paths, do not cross any of the first, second, and third conduction paths 141, 142, and 145, which serve as power source paths. This reduces noise sneaking into the fourth conduction paths 123, 124, and 125 from the first, second, and third conduction paths 141, 142, and 145, and thus the noise characteristics of the high-frequency module 100 are improved.

The foregoing describes making the second wiring conductor longer than the exclusive part of the first wiring conductor in order to set the second inductance L2 of the second conduction path 142 higher than the first inductance L1 of the exclusive part of the first conduction path 141. However, the configuration is not limited to this example.

For example, although not illustrated in the drawings, the second inductance L2 may be made higher than the first inductance L1 by inserting an inductor element into the second conduction path 142. In this case, the first conduction path 141 is constituted by the first wiring conductor as described earlier, and the second conduction path 142 is constituted by the second wiring conductor and the inductor element inserted into the second wiring conductor.

According to this configuration, the second inductance L2 can be made higher than the first inductance L1 on the basis of the inductance of the inductor element.

Figure 5:
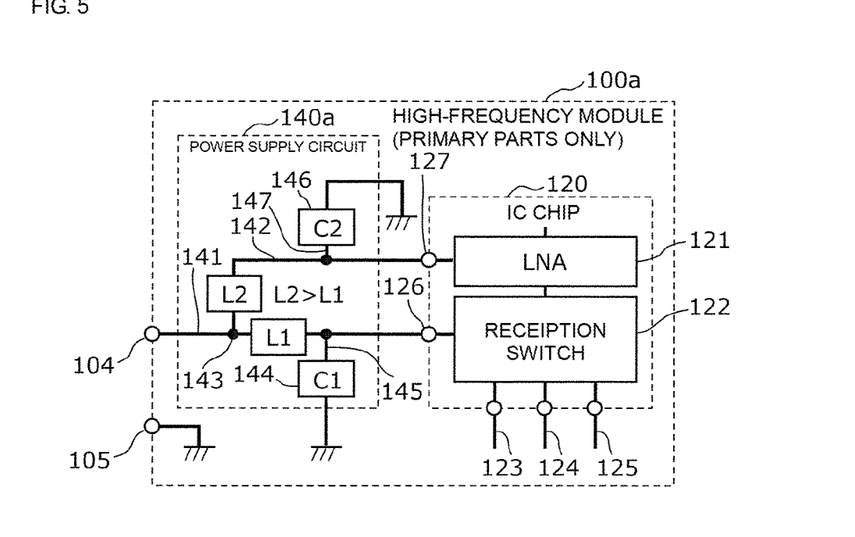
FIG. 5 is a block diagram illustrating an example of the functional configuration of the primary parts of the high-frequency module according to a variation on the first embodiment.

Next, a variation on the high-frequency module will be described.

FIG. 5 is a block diagram illustrating an example of the functional configuration of the primary parts of a high-frequency module 100a according to a variation. Compared to the high-frequency module 100 illustrated in FIG. 2, the high-frequency module 100a includes a power supply circuit 140a. A fifth conduction path 147 and a capacitor 146 inserted into the fifth conduction path 147 are added to the power supply circuit 140a.

As a result, the effects of source noise on the LNA121 and the reception switch 122 are reduced by the capacitors 144 and 146, and thus a high-frequency module 100a having even better noise characteristics can be obtained.

Second Embodiment

A second embodiment describes a communication apparatus including the high-frequency module according to the first embodiment and the variation thereon.

Figure 6:
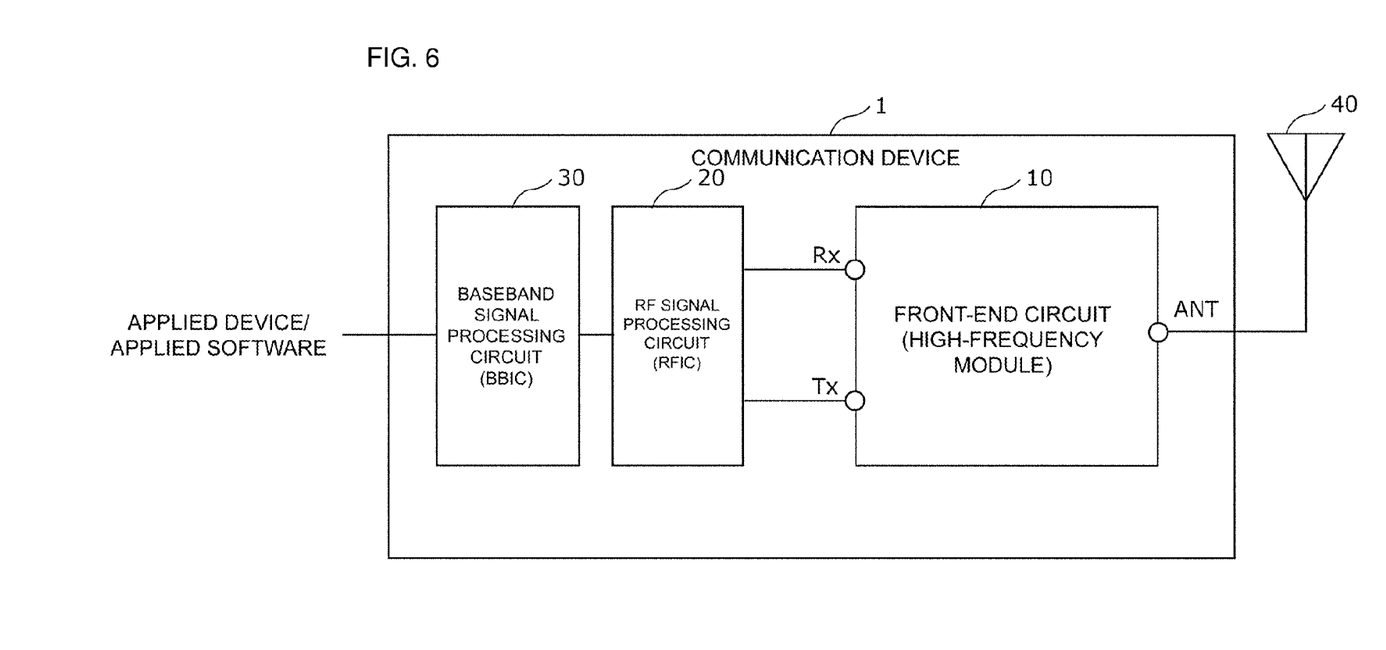
FIG. 6 is a block diagram illustrating an example of the functional configuration of a communication apparatus according to a second embodiment.

FIG. 6 is a block diagram illustrating an example of the functional configuration of a communication apparatus 1 according to the second embodiment. As illustrated in FIG. 6, the communication apparatus 1 includes a front-end circuit 10, an RF signal processing circuit 20, and a baseband signal processing circuit 30.

The front-end circuit 10 amplifies a transmission RF signal generated by the RF signal processing circuit 20 using a power amplifier and supplies that signal to an antenna 40, and amplifies a reception RF signal received by the antenna 40 using a low-noise amplifier and supplies that signal to the RF signal processing circuit 20. The front-end circuit 10 is constituted by the high-frequency module according to the first embodiment and the variation thereon.

The RF signal processing circuit 20 converts a transmission signal generated by the baseband signal processing circuit 30 into a transmission RF signal and supplies that signal to the front-end circuit 10. This conversion may include signal modulation and upconversion. The reception RF signal received from the front-end circuit 10 is converted into a reception signal and supplied to the baseband signal processing circuit 30. This conversion may include signal demodulation and downconversion. The RF signal processing circuit 20 may be constituted by a high-frequency integrated circuit (RFIC) chip.

The baseband signal processing circuit 30 converts transmission data generated by an applied device/applied software into a transmission signal and supplies the signal to the RF signal processing circuit 20. This conversion may include data compression, multiplexing, adding error correction code, and so on. Additionally, the reception signal received from the RF signal processing circuit 20 is converted into reception data and supplied to the applied device/applied software. This conversion may include data decompression, demultiplexing, and error correction. The baseband signal processing circuit 30 may be constituted by a baseband integrated circuit (BBIC) chip.

The applied device/applied software carries out applied operations such as voice calls, image display, and so on using the transmission data and the reception data.

According to the communication apparatus 1, using the high-frequency module according to the first embodiment and the variation thereon as the front-end circuit 10 makes it possible to share a power source terminal, a power source line, and the like for supplying power to a plurality of circuits while suppressing noise sneaking in through the shared power source terminal, power source line, and so on.

A high-frequency module and a communication apparatus according to embodiments of the present disclosure have been described thus far, but the present disclosure is not intended to be limited to individual embodiments. Variations on these embodiments conceived of by those skilled in the art, embodiments created by combining constituent elements from different embodiments, and so on may be included in the scope of one or more aspects of the present disclosure as long as they do not depart from the essential spirit of the present disclosure.

For example, in the high-frequency module 100 illustrated in FIG. 1, the output of the LNA121 is outputted to the single RF signal output terminal 102. However, the RF signal output terminal 102 is not limited to one.

For example, although not illustrated, a plurality of RF signal output terminals and an output switch may be provided, and output of the LNA121 may be switched among the plurality of RF signal output terminals using the output switch.

In this case, the power supply circuit 140 supplies the source voltage to the output switch and the LNA121 instead of the reception switch 122. Noise sneaking into the LNA121 from the output switch is dampened by the power supply circuit 140 in the same manner as described in the embodiments.

As a result, a high-frequency module capable of sharing power source terminals and power source lines to supply power to a plurality of circuits while suppressing noise that sneaks in through the shared power source terminals and power source lines can be obtained.

The present disclosure can be broadly used as a high-frequency module in various types of communication apparatuses.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high-frequency module comprising:
   a board;
   a power receiving terminal that is disposed on the board and that is configured for receiving a power supply from a power source;
   an amplifying circuit disposed on the board;
   a switch circuit disposed on the board and configured to switch among a plurality of signals and communicate the signals to the amplifying circuit;
   a first conduction path electrically connecting the power receiving terminal to a power source terminal of the switch circuit;
   a second conduction path electrically connecting a branching point in the first conduction path to a power source terminal of the amplifying circuit;
   a third conduction path electrically connecting at least one of the first conduction path and the second conduction path to ground; and
   a capacitor in the third conduction path,
   wherein an inductance of the first conduction path between the branching point and the power source terminal of the switch circuit is less than an inductance of the second conduction path.

2. The high-frequency module according to claim 1, wherein:
   the first conduction path is constituted by a first wiring conductor;
   the second conduction path is constituted by a second wiring conductor; and
   a length of the second wiring conductor is longer than a length of the first wiring conductor between the branching point and the power source terminal of the switch circuit.

3. The high-frequency module according to claim 1, wherein:
   the first conduction path is constituted by a first wiring conductor; and
   the second conduction path is constituted by a second wiring conductor and an inductor element in the second wiring conductor.

4. The high-frequency module according to claim 1,
   wherein the switch circuit and the amplifying circuit are provided on a single integrated circuit chip, the power source terminal of the switch circuit serving as a first power source terminal of the integrated circuit chip, and the power source terminal of the amplifying circuit serves as a second power source terminal of the integrated circuit chip.

5. The high-frequency module according to claim 1, further comprising:
   a demultiplexing circuit disposed on the board; and
   a fourth conduction path electrically connecting the switch circuit to the demultiplexing circuit,
   wherein the fourth conduction path does not intersect the first conduction path in any plan view of the board, does not intersect the second conduction path in any plan view of the board, and does not intersect the third conduction path in any plan view of the board.

6. The high-frequency module according to claim 2, further comprising:
   a demultiplexing circuit disposed on the board; and
   a fourth conduction path electrically connecting the switch circuit to the demultiplexing circuit,
   wherein the fourth conduction path does not intersect the first conduction path in any plan view of the board, does not intersect the second conduction path in any plan view of the board, and does not intersect the third conduction path in any plan view of the board.

7. The high-frequency module according to claim 3, further comprising:
   a demultiplexing circuit disposed on the board; and
   a fourth conduction path electrically connecting the switch circuit to the demultiplexing circuit,
   wherein the fourth conduction path does not intersect the first conduction path in any plan view of the board, does not intersect the second conduction path in any plan view of the board, and does not intersect the third conduction path in any plan view of the board.

8. The high-frequency module according to claim 4, further comprising:
   a demultiplexing circuit disposed on the board; and
   a fourth conduction path electrically connecting the switch circuit to the demultiplexing circuit,
   wherein the fourth conduction path does not intersect the first conduction path in any plan view of the board, does not intersect the second conduction path in any plan view of the board, and does not intersect the third conduction path in any plan view of the board.

9. The high-frequency module according to claim 1, wherein the capacitor is a ceramic capacitor.

10. A communication apparatus comprising:
    the high-frequency module according to claim 1; and
    a radio frequency (RF) signal processing circuit that transmits a high-frequency transmission signal to the high-frequency module and receives a high-frequency reception signal from the high-frequency module.

* * * * *